(12) United States Patent
Narazaki et al.

(10) Patent No.: US 9,799,648 B2
(45) Date of Patent: Oct. 24, 2017

(54) SEMICONDUCTOR DEVICE

(71) Applicant: Mitsubishi Electric Corporation, Tokyo (JP)

(72) Inventors: Atsushi Narazaki, Tokyo (JP); Shinya Soneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/990,092

(22) Filed: Jan. 7, 2016

(65) Prior Publication Data

US 2016/0293595 A1    Oct. 6, 2016

(30) Foreign Application Priority Data

Apr. 6, 2015    (JP) .................................. 2015-077490

(51) Int. Cl.
*H01L 27/07* (2006.01)
*H01L 29/423* (2006.01)
(Continued)

(52) U.S. Cl.
CPC ...... *H01L 27/0755* (2013.01); *H01L 29/0619* (2013.01); *H01L 29/41741* (2013.01);
(Continued)

(58) Field of Classification Search
CPC .......... H01L 29/66348; H01L 29/7397; H01L 29/861
USPC .......... 257/262, 368–401, E29.255–E29.313, 257/E29.315–E29.316, E29.013, E29.027, 257/330, 332, 341; 438/135, 151, 197, 438/199, 201, 207, 216
See application file for complete search history.

(56) References Cited

U.S. PATENT DOCUMENTS 7,705,398 B2 *   4/2010   Kaneda ............... H01L 29/0834
257/341
7,847,345 B2   12/2010   Takahashi
(Continued)

FOREIGN PATENT DOCUMENTS

JP    2008-053648 A    3/2008
JP    2008-103590 A    5/2008

OTHER PUBLICATIONS

An Office Action issued by the Korean Patent Office on Mar. 28, 2017, which corresponds to Korean Patent Application No. 10-2016-0035082 and is related to U.S. Appl. No. 14/990,092; with English language translation.

*Primary Examiner* — Jonathan Han
(74) *Attorney, Agent, or Firm* — Studebaker & Brackett PC

(57) ABSTRACT

A semiconductor device of the present invention includes: an IGBT including an emitter layer on a first main surface side of a semiconductor substrate and a collector layer on a second main surface side of the semiconductor substrate; a freewheeling diode including an anode layer on the first main surface side of the semiconductor substrate and a cathode layer on the second main surface side of the semiconductor substrate; a well region that is located in a boundary between the IGBT and the freewheeling diode and separates the IGBT and the freewheeling diode; a first electrode located on the first main surface of the semiconductor substrate so as to be connected to the emitter layer, the anode layer, and the well region; a resistance element located between the well region and the first electrode.

9 Claims, 10 Drawing Sheets

(51) Int. Cl.
*H01L 29/739* (2006.01)
*H01L 29/417* (2006.01)
*H01L 29/06* (2006.01)
*H01L 29/861* (2006.01)

(52) U.S. Cl.
CPC ...... *H01L 29/7397* (2013.01); *H01L 29/8613* (2013.01); *H01L 29/0692* (2013.01); *H01L 29/0696* (2013.01)

(56) References Cited

U.S. PATENT DOCUMENTS

| | | | |
|---|---|---|---|
| 2008/0315249 A1* | 12/2008 | Minato | H01L 29/407 257/139 |
| 2010/0301410 A1* | 12/2010 | Hirler | H01L 29/7813 257/334 |
| 2012/0146090 A1* | 6/2012 | Lui | H01L 29/8613 257/139 |
| 2013/0260515 A1* | 10/2013 | Mizushima | H01L 29/66325 438/135 |
| 2014/0070270 A1* | 3/2014 | Yoshida | H01L 29/66128 257/140 |
| 2015/0014743 A1 | 1/2015 | Werber et al. | |

* cited by examiner

F I G. 1
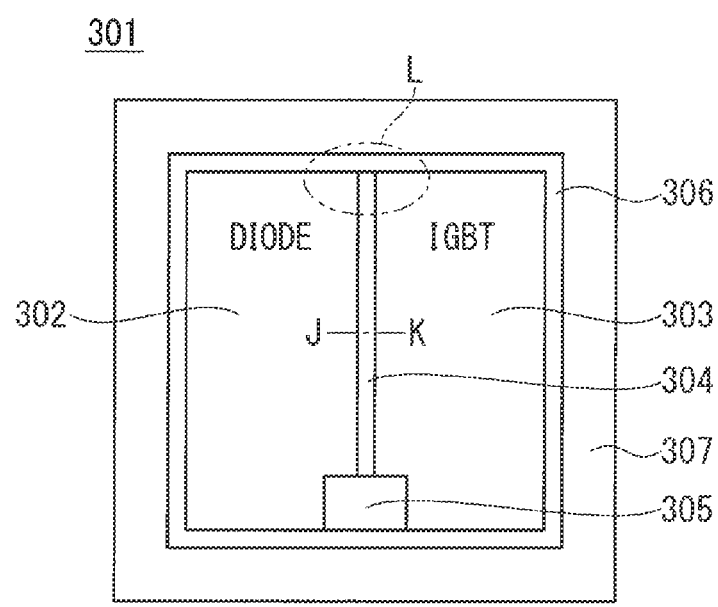

F I G. 7
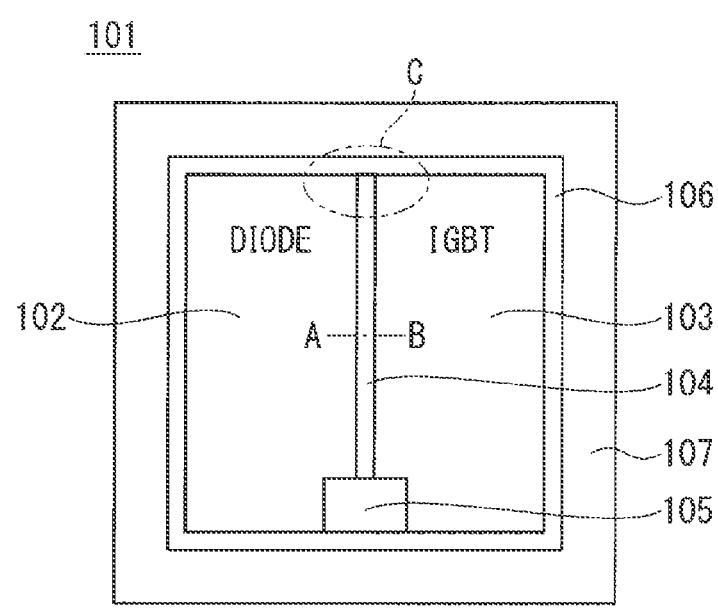

US 9,799,648 B2

SEMICONDUCTOR DEVICE

BACKGROUND OF THE INVENTION

Field of the Invention

The present invention relates to a semiconductor device, and more particularly, to an insulated gate bipolar transistor including a freewheeling diode built-in.

Description of the Background Art

Power devices being power semiconductor elements are widely used in the fields ranging from household electrical appliances, electric-powered vehicles, and railroads to solar-electric power generation and wind power generation that increasingly attract attention as "renewable energy." Inverter circuits are often built in the power devices to drive inductive loads of induction motors in those fields. In this case, freewheeling diodes (hereinafter simply referred to as diodes) for causing currents generated by a counter electromotive force of the inductive loads to flow back are needed, and the inverter circuits are normally formed of a plurality of insulated gate bipolar transistors (hereinafter referred to as IGBTs) and diodes. However, size, weight, and cost reductions of inverter devices are greatly needed, so that a plurality of semiconductor elements are not preferably installed. Thus, as a method for solving this, reverse conducting IGBTs (hereinafter referred to as RC-IGBTs) that include each of the IGBTs and the diodes formed into the same chip have been developed (see Japanese Patent Application Laid-Open No. 2008-53648 and Japanese Patent Application Laid-Open No. 2008-103590, for example). Consequently, reductions in areas on which the semiconductor elements are installed and in costs are promising.

Such RC-IGBT includes the IGBT and the diode formed on one semiconductor substrate, but both of the elements need to be formed simultaneously instead of individually to achieve low costs. An impurity concentration of the outermost surface of an anode diffusion layer directly below an emitter electrode of the IGBT typically needs to be increased. However, recovery properties of the diode are contrarily decreased, so that the impurity concentration of the surface cannot be set sufficiently high.

SUMMARY OF THE INVENTION

It is an object of the present invention to provide a semiconductor device in which recovery properties of a diode are improved, the semiconductor device including an IGBT and the diode formed on one semiconductor substrate.

A semiconductor device of the present invention includes: an insulated gate bipolar transistor including an emitter layer on a first main surface side of a semiconductor substrate and a collector layer on a second main surface side of the semiconductor substrate; and a freewheeling diode including an anode layer on the first main surface side of the semiconductor substrate and a cathode layer on the second main surface side of the semiconductor substrate. The semiconductor device of the present invention includes a well region that is located in a boundary between the insulated gate bipolar transistor and the freewheeling diode and separates the insulated gate bipolar transistor and the freewheeling diode. The semiconductor device of the present invention includes a first electrode located on the first main surface of the semiconductor substrate so as to be connected to the emitter layer, the anode layer, and the well region; a resistance element located between the well region and the first electrode; and a second electrode located on the second main surface of the semiconductor substrate so as to be connected to the collector layer and the cathode layer.

In the semiconductor device of the present invention, the resistance element is located between the well region and the first electrode. The resistance element suppresses an injection of holes from the well region when the freewheeling diode is in an ON state. This suppresses a reverse recovery current when the freewheeling diode is turned off. Thus, the recovery properties can be improved in the semiconductor device including the freewheeling diode and the insulated gate bipolar transistor formed on the same substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view of a semiconductor device in a preferred embodiment of the present invention;

FIG. 7 is a plan view of a semiconductor device in a prerequisite technology;

DESCRIPTION OF THE PREFERRED EMBODIMENT

<Prerequisite Technology>

Figure 8:
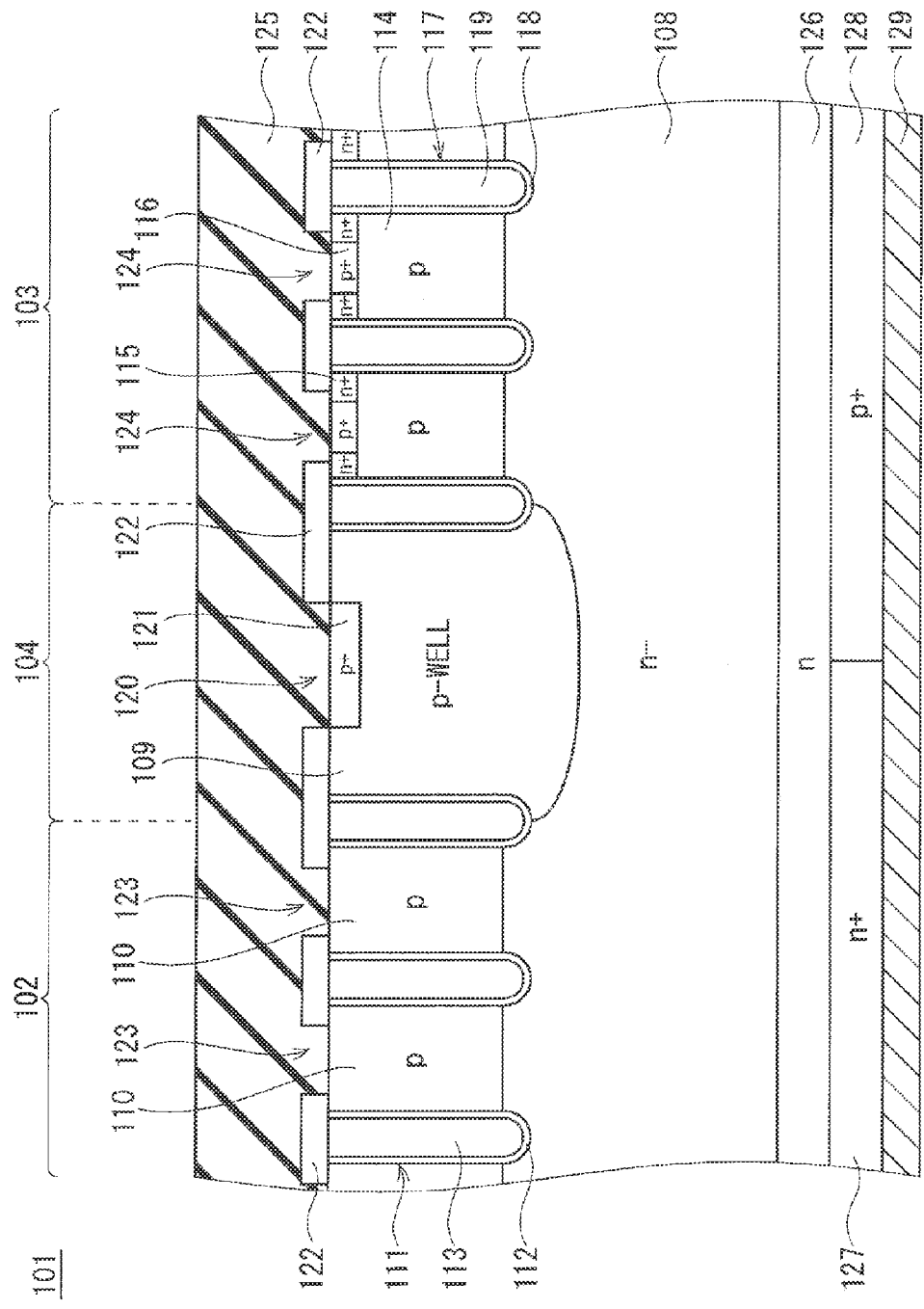
FIG. 8 is a cross-sectional view of the semiconductor device in the prerequisite technology.
Figure 9:
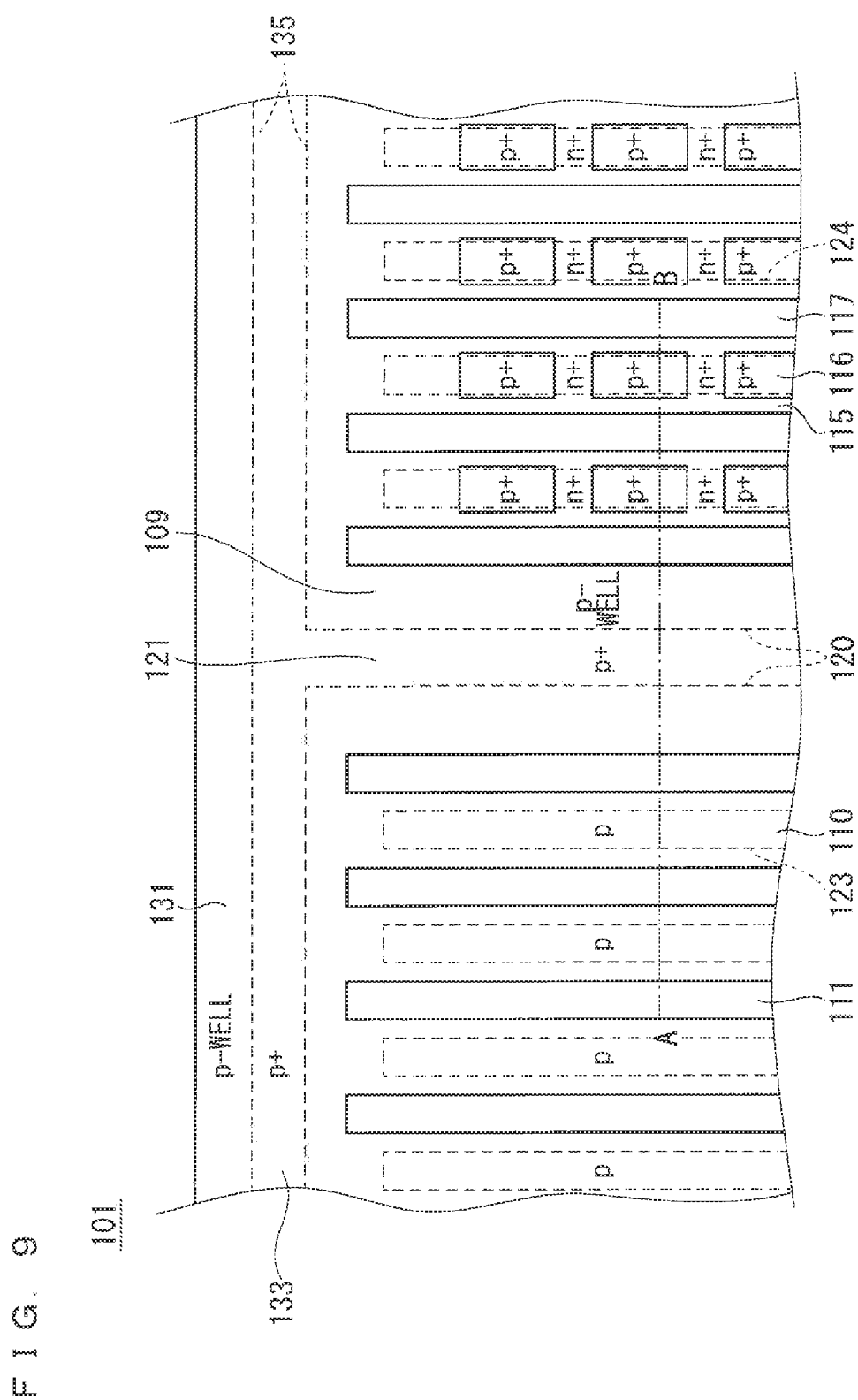
FIG. 9 is an enlarged plan view of a region C in FIG. 4.

A prerequisite technology of the present invention is described before a preferred embodiment of the present invention is described. FIG. 7 is a plan view of a semiconductor device (namely, RC-IGBT 101) in the prerequisite technology. FIG. 8 is a cross-sectional view taken along an A-B line segment across a region of a diode 102 and a region of an IGBT 103 in FIG. 7. FIG. 9 is an enlarged plan view of a region C in FIG. 7.

As shown in FIG. 7, the RC-IGBT 101 includes the diode 102 and the IGBT 103. A well region 104 is located between the diode 102 and the IGBT 103. A p-well 109 is located in the well region 104 so as to separate the diode 102 and the IGBT 103. The RC-IGBT 101 further includes a gate pad region 105, a termination region 106, and a breakdown voltage holding region 107.

As shown in FIG. 8, an n⁻ drift layer 108 common to the diode 102 and the IGBT 103 is located on a semiconductor substrate. The p-well 109 is located on an upper surface side of the n⁻ drift layer 108 so as to separate the diode 102 and the IGBT 103. A trench 111 is located in the diode 102 so as to penetrate a p-anode layer 110.

A conductive polysilicon 113 is buried in an interior wall of the trench 111 with an oxide film 112 therebetween. The trench 111 has an effect of stabilizing breakdown voltage characteristics. In addition, there are conventional examples in which the trench 111 is not formed.

A p-base layer 114 is located on the upper surface side of the n⁻ drift layer 108 in the IGBT 103. An n⁺ emitter layer 115 and a p⁺ contact layer 116 are located in an upper surface of the p-base layer 114. A trench 117 is located so as to penetrate the n⁺ emitter layer 115 and the p-base layer 114.

A conductive polysilicon 119 is buried in an interior wall of the trench 117 with a gate oxide film 118 therebetween, and the conductive polysilicon 119 functions as a gate of the IGBT 103.

The well region 104 being the boundary between the diode 102 and the IGBT 103 has the function of separating electrical operations of the diode 102 and the IGBT 103. The p-well 109 formed by a deep diffusion layer of p-type impurities is located in the well region 104. A p⁺ contact layer 121 is located in an opening 120 on the p-well 109.

The p-anode layer 110 and the trench 111 of the diode 102, the n⁺ emitter layer 115, the p⁺ contact layer 116, and the trench 117 of the IGBT 103, and the p-well 109 in the well region 104 are covered with an insulating film 122. Openings 123, openings 124, and the opening 120 are located in the insulating film 122.

The p-anode layer 110 of the diode 102 is connected to an emitter electrode 125 through the openings 123. The p-base layer 114, the n⁺ emitter layer 115, and the p⁺ contact layer 116 of the IGBT 103 are connected to the emitter electrode 125 through the openings 124. The p⁺ contact layer 121 located on the upper surface side of the p-well 109 is connected to the emitter electrode 125 through the opening 120.

To improve ohmic properties of the p-anode layer 110 of the diode 102 and the emitter electrode 125, a p⁺ contact region may be formed between the p-anode layer 110 and the emitter electrode 125. For the similar reason, a barrier metal layer may be formed between the p-anode layer 110 and the emitter electrode 125. The barrier metal layer may be formed between the n⁺ emitter layer 115 and the p⁺ contact layer 116 of the IGBT 103 and the emitter electrode 125.

An n-buffer layer 126 and an n⁺ cathode layer 127 are located on a lower surface side of the n⁺ drift layer 108 directly below the diode 102. The n-buffer layer 126 being a layer common to the diode 102 and a p⁺ collector layer 128 are located on the lower surface side of the n⁺ drift layer 108 directly below the IGBT 103.

The n⁺ cathode layer 127 and the p⁺ collector layer 128 are connected to a collector electrode 129 being a common electrode. Herein, to prevent interdiffusion of metal and improve the ohmic properties, the collector electrode 129 has a lamination of a Ti layer, a Ni layer, and a Au layer or a lamination of a AlSi layer, the Ti layer, the Ni layer, and the Au layer in the stated order from the silicon side, for example.

Next, the termination region 106 shown in FIGS. 7 and 9 is described. A gate wiring pattern is omitted from FIG. 9 for the sake of convenience. As shown in FIG. 7, the termination region 106 is located so as to surround the diode 102 and the IGBT 103. The well region 104 is connected to the termination region 106 in the region C in FIG. 7. In other words, as shown in FIG. 9, the p-well 109 in the well region 104 is connected to a p-well 131 in the termination region 106. A p⁺ contact layer 133 is located in the termination region 106 to improve the ohmic properties similarly to the well region 104. The insulating film 122 is also located on the termination region 106, and an opening 135 is located such that the p⁺ contact layer 133 is connected to the emitter electrode 125. The p-well 131 in the termination region 106 separates the diode 102 and the IGBT 103 from the breakdown voltage holding region 107.

Figure 10:
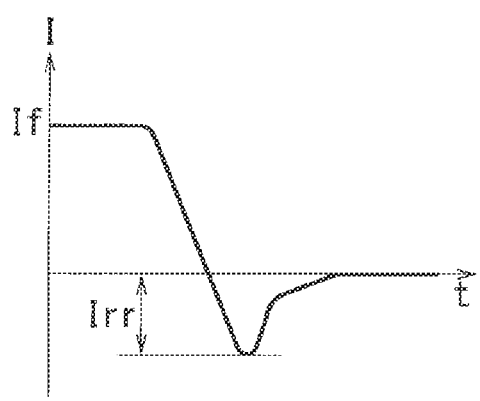
FIG. 10 is a diagram showing a waveform of a current at the time of reverse recovery of a diode.

Herein, recovery properties of the diode are simply described. FIG. 10 is a diagram showing a waveform of a current at the time of reverse recovery when the diode is switched from an ON state to an OFF state. When the diode is switched from the ON state to the OFF state, a reverse current flows from the n⁺ cathode layer to the p-anode layer. A peak value of the reverse current is referred to as a recovery current (Irr). This current results in an energy loss, so that the recovery current needs to be low.

As a technique for reducing the recovery current, an impurity concentration of the p-anode layer is typically decreased. At the same time, this results in decreased ohmic properties and decreased efficiency of an injection of carriers, thereby increasing a forward voltage Vf.

In the prerequisite technology, the p-well 109 that separates the diode 102 and the IGBT 103 also functions as an anode layer of the diode, so that this region causes an increase in a recovery loss. The preferred embodiment of the present invention described below solves these problems above.

<Preferred Embodiment of the Present Invention>

Figure 2:
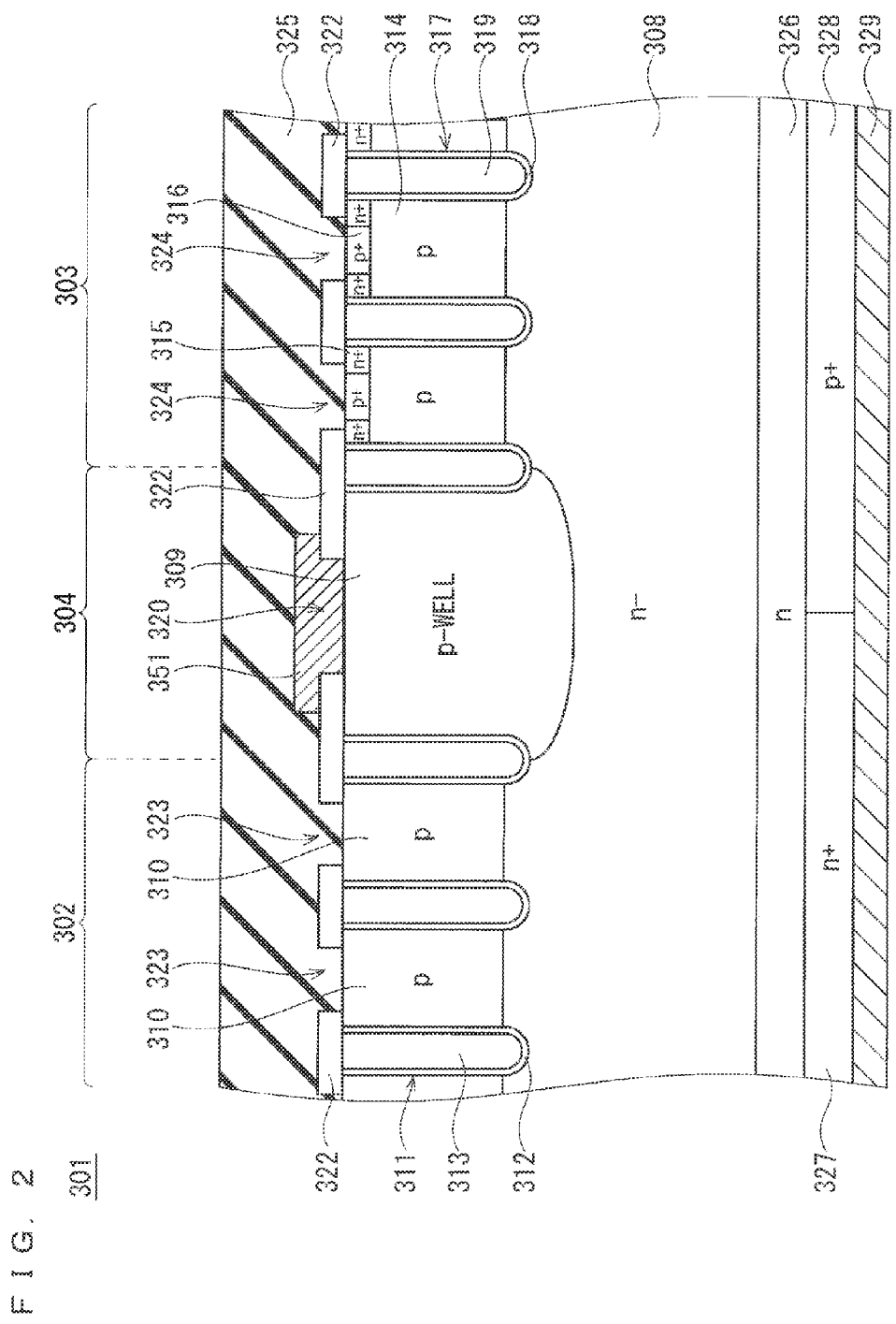
FIG. 2 is a cross-sectional view of the semiconductor device in the preferred embodiment of the present invention.
Figure 3:
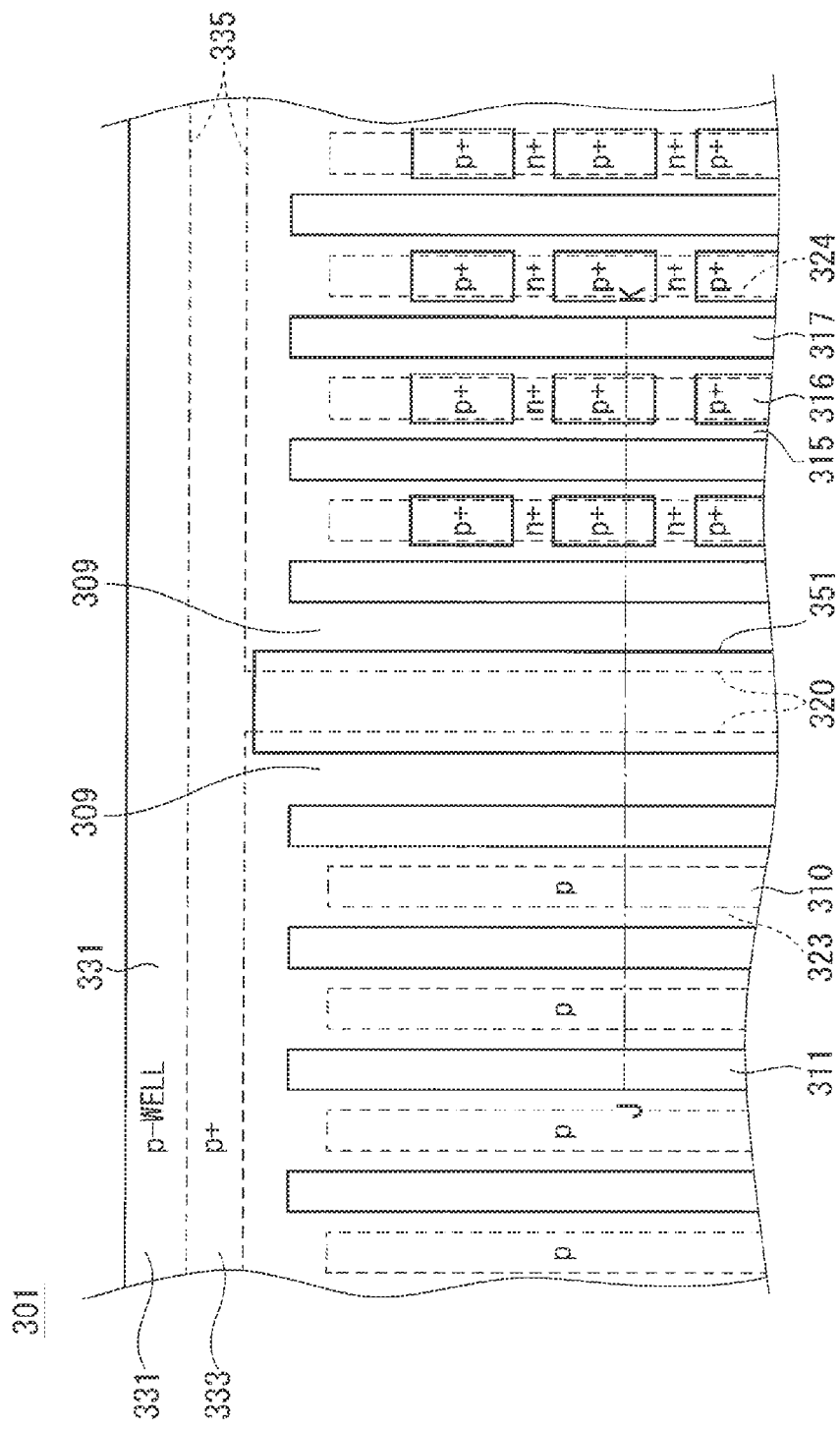
FIG. 3 is an enlarged plan view of a region L in FIG. 1.

FIG. 1 is a plan view of a semiconductor device (namely, RC-IGBT 301) in the preferred embodiment of the present invention. FIG. 2 is a cross-sectional view taken along a J-K line segment across a region of a diode 302 and a region of an IGBT 303 in FIG. 1. FIG. 3 is an enlarged plan view of a region L in FIG. 1. In FIG. 2, an upper surface of a substrate is a first main surface while a lower surface thereof is a second main surface.

As shown in FIG. 1, the RC-IGBT 301 includes the diode 302 and the IGBT 303. A well region 304 is located between the diode 302 and the IGBT 303. A p-well 309 is located in the well region 304 so as to separate the diode 302 and the IGBT 303. The RC-IGBT 301 further includes a gate pad region 305, a termination region 306, and a breakdown voltage holding region 307.

As shown in FIG. 2, an n⁺ drift layer 308 common to the diode 302 and the IGBT 303 is located on the semiconductor substrate. The p-well 309 is located on an upper surface side of the n⁺ drift layer 308 so as to separate the diode 302 and the IGBT 303. A trench 311 is located in the diode 302 so as to penetrate a p-anode layer 310.

A conductive polysilicon 313 is buried in an interior wall of the trench 311 with an oxide film 312 therebetween. The trench 311 has an effect of stabilizing breakdown voltage characteristics.

A p-base layer 314 is located on the upper surface side of the n⁺ drift layer 308 in the IGBT 303. An n⁺ emitter layer 315 and a p⁺ contact layer 316 are located in an upper surface of the p-base layer 314. A trench 317 is located so as to penetrate the n⁺ emitter layer 315 and the p-base layer 314.

A conductive polysilicon 319 is buried in an interior wall of the trench 317 with a gate oxide film 318 therebetween, and the conductive polysilicon 319 functions as a gate of the IGBT 303.

The well region 304 being the boundary between the diode 302 and the IGBT 303 has the function of separating electrical operations of the diode 302 and the IGBT 303. The p-well 309 formed by a deep diffusion layer of p-type impurities is located in the well region 304. A resistance element 351 made of a conductive polysilicon is located on the p-well 309. The p-well 309 is electrically connected to the resistance element 351.

The p-anode layer 310 and the trench 311 of the diode 302, the $n^+$ emitter layer 315, the $p^+$ contact layer 316, and the trench 317 of the IGBT 303, and the p-well 309 in the well region 304 are covered with an insulating film 322. Openings 323, openings 324, and an opening 320 are located in the insulating film 322.

The p-anode layer 310 of the diode 302 is connected to an emitter electrode 325 through the openings 323. The p-base layer 314, the $n^+$ emitter layer 315, and the $p^+$ contact layer 316 of the IGBT 303 are connected to the emitter electrode 325 through the openings 324. The resistance element 351 located on the upper surface side of the p-well 309 is connected to the emitter electrode 325 through the opening 320. As shown in FIG. 3, the opening 320 has a continuous slit shape.

To improve the ohmic properties of the p-anode layer 310 of the diode 302 and the emitter electrode 325, a $p^+$ contact region may be formed between the p-anode layer 310 and the emitter electrode 325. For the similar reason, a barrier metal layer of TiN or the like may be formed between the p-anode layer 310 and the emitter electrode 325. The barrier metal layer of TiN or the like may also be formed between the $n^+$ emitter layer 315 and the $p^+$ contact layer 316 of the IGBT 303 and the emitter electrode 325. An n-buffer layer 326 and an $n^+$ cathode layer 327 are located on a lower surface side of the $n^-$ drift layer 308 directly below the diode 302. The n-buffer layer 326 being a layer common to the diode 302 and a $p^+$ collector layer 328 are located on the lower surface side of the $n^-$ drift layer 308 directly below the IGBT 303.

The $n^+$ cathode layer 327 and the $p^+$ collector layer 328 are connected to a collector electrode 329 being a common electrode. Herein, to prevent interdiffusion of metal and improve the ohmic properties, the collector electrode 329 has a lamination of a Ti layer, a Ni layer, and a Au layer or a lamination of a AlSi layer, the Ti layer, the Ni layer, and the Au layer in the stated order from the silicon side, for example.

Next, the termination region 306 shown in FIGS. 1 and 3 is described. A gate wiring pattern is omitted from FIG. 3 for the sake of convenience. As shown in FIG. 3, the termination region 306 is located so as to surround the diode 302 and the IGBT 303. The well region 304 is connected to the termination region 306 in the region L in FIG. 1. In other words, as shown in FIG. 3, the p-well 309 in the well region 304 is connected to a p-well 331 in the termination region 306. A $p^+$ contact layer 333 is located in the termination region 306 to improve the ohmic properties. The insulating film 322 is also located on the termination region 306, and an opening 335 is located such that the $p^+$ contact layer 333 is connected to the emitter electrode 325. The p-well 331 in the termination region 306 separates the diode 302 and the IGBT 303 from the breakdown voltage holding region 307.

In this preferred embodiment, the diode 302 has the trench structure, but a planar diode without a trench has the same effects.

The IGBT 303 in this preferred embodiment does not include a carrier storage layer, but a charge-storage trench gate bipolar transistor including the carrier storage layer has the same effects. The IGBT 303 in this preferred embodiment has the same effects if the IGBT 303 is an injection enhanced type. The IGBT 303 includes the $p^+$ contact layer 316 in this preferred embodiment and has the same effects without the $p^+$ contact layer 316.

The conductive polysilicon is used as the resistance element 351 in this preferred embodiment, and the resistance element 351 of metal such as titanium (Ti) and cobalt (Co) has the same effects.

The punch-through IGBT including the n-buffer layer 326 is described in this preferred embodiment, but a non-punch-through IGBT without the n-buffer layer 326 has the same effects.

<Effects>

The semiconductor device (RC-IGBT 301) in the preferred embodiment of the present invention includes: the insulated gate bipolar transistor (IGBT 303) including the emitter layer ($n^+$ emitter layer 315) on the first main surface side of the semiconductor substrate and the collector layer ($p^+$ collector layer 328) on the second main surface side of the semiconductor substrate; the freewheeling diode (diode 302) including the anode layer 310 on the first main surface side of the semiconductor substrate and the cathode layer ($n^+$ cathode layer 327) on the second main surface side of the semiconductor substrate; the well region 304 that is located in the boundary between the insulated gate bipolar transistor and the freewheeling diode and separates the insulated gate bipolar transistor and the freewheeling diode; the first electrode (emitter electrode 325) located on the first main surface of the semiconductor substrate so as to be connected to the emitter layer, the anode layer, and the well region 304; the resistance element 351 located between the well region 304 and the first electrode; and the second electrode (collector electrode 329) located on the second main surface of the semiconductor substrate so as to be connected to the collector layer and the cathode layer.

The semiconductor device (RC-IGBT 301) in this preferred embodiment includes the resistance element 351 located between the p-well 309 and the emitter electrode 325 in the well region 304 that separates the diode 302 and the IGBT 303. The resistance element 351 suppresses an injection of holes from the p-well 309 when the diode 302 is in the ON state. This suppresses a reverse recovery current when the diode 302 is turned off. Thus, recovery properties can be improved in the RC-IGBT 301 including the diode 302 and the IGBT 303 formed on the same substrate.

In the semiconductor device (RC-IGBT 301) in this preferred embodiment, the resistance element 351 comprises polysilicon.

Polysilicon is used as the gate electrode of the IGBT 303, so that using polysilicon being the same material for the resistance element 351 can prevent complex manufacturing steps. Moreover, polysilicon is widespread as an electrode material, so that an increase in manufacturing costs can be suppressed.

In the semiconductor device (RC-IGBT 301) in this preferred embodiment, the resistance element 351 may comprise titanium. Therefore, the same effects can be obtained if the resistance element 351 is made of titanium instead of polysilicon.

In the semiconductor device (RC-IGBT 301) in this preferred embodiment, the resistance element 351 may comprise cobalt. Therefore, the same effects can be obtained if the resistance element 351 is made of cobalt instead of polysilicon.

In the semiconductor device (RC-IGBT 301) in this preferred embodiment, the insulated gate bipolar transistor (IGBT 303) may be an injection enhanced type. Therefore, the same effects can be obtained if the IGBT 303 is an injection enhanced gate transistor (IEGT).

\<First Modification of Preferred Embodiment of the Present Invention\>

Figure 4:
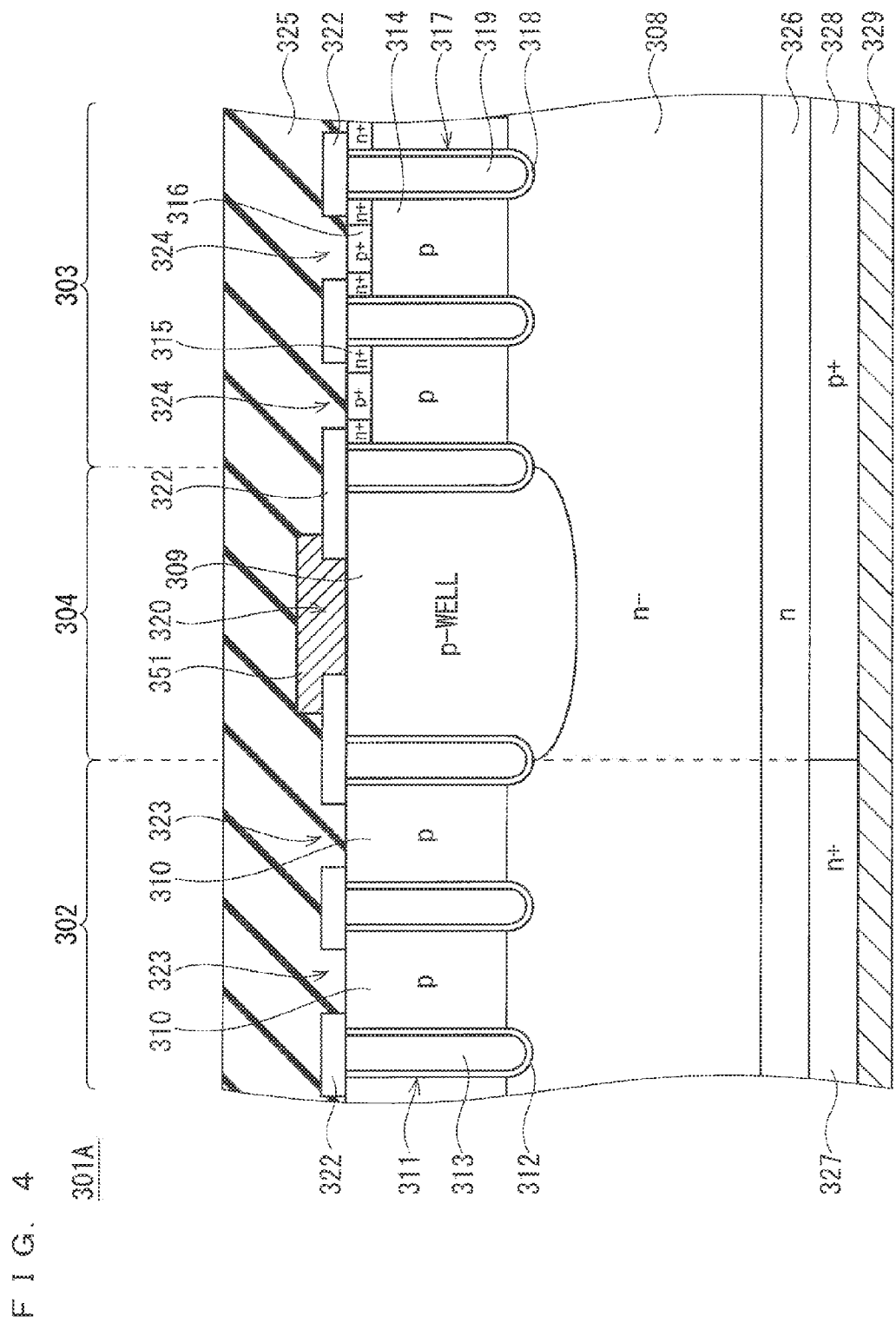
FIG. 4 is a cross-sectional view of a semiconductor device in a first modification of the preferred embodiment of the present invention.

FIG. 4 is a cross-sectional view of a semiconductor device (RC-IGBT 301A) in a first modification. As shown in FIG. 4, the p$^+$ collector layer 328 of the IGBT 303 extends to the diode 302 side in the first modification. The p-well 309 in the well region 304 is included in the p$^+$ collector layer 328 of the IGBT 303 in plan view. The other configurations are the same as those of the RC-IGBT 301 (FIGS. 1 to 3), so that descriptions will be omitted.

\<Effects\>

In the semiconductor device (RC-IGBT 301A) in the first modification of the preferred embodiment of the present invention, the well region 304 overlaps the collector layer (p$^+$ collector layer 328) so as to be included in the collector layer in plan view. The p-well 309 functions as the freewheeling diode (diode 302). Thus, the holes injected from the p-well 309 when the diode 302 is ON cause a recovery current to be generated when the diode 302 is turned off. In the first modification, as shown in FIG. 4, the p$^+$ collector layer 328 extends directly below the p-well 309 instead of the e cathode layer 327. Therefore, the injection of electrons from the n$^+$ cathode layer 327 is suppressed when the diode 302 is ON, thereby reducing a density of carriers directly below the p-well 309. Consequently, the recovery current when the diode 302 is turned off can be suppressed.

\<Second Modification of Preferred Embodiment of the Present Invention\>

Figure 5:
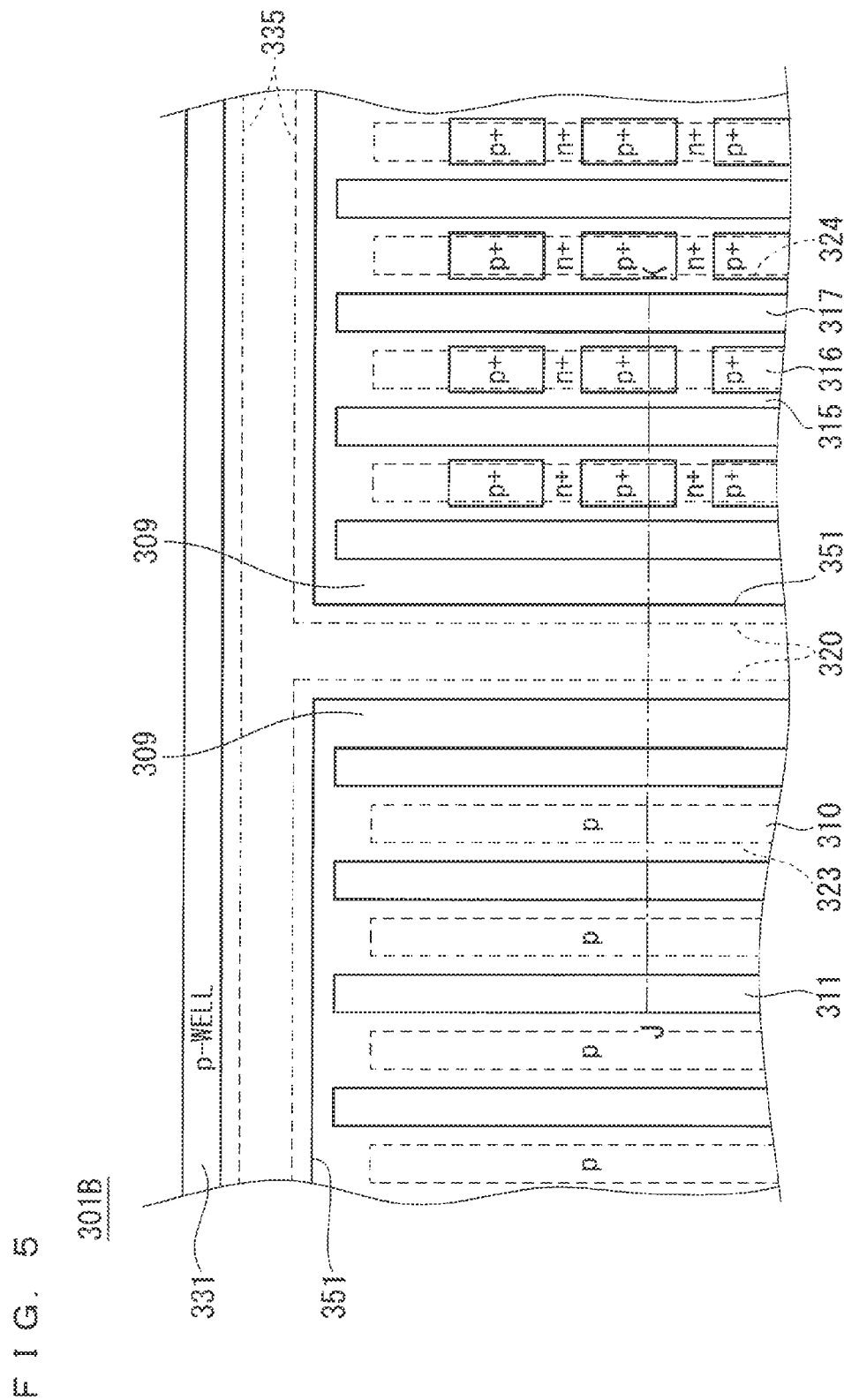
FIG. 5 is a plan view of a semiconductor device in a second modification of the preferred embodiment of the present invention.

FIG. 5 is a plan view of a semiconductor device (RC-IGBT 301B) in a second modification. In the second modification, a termination region 306 has the same structure as the well region 304. In other words, the termination region 306 also includes the resistance element 351 between the p-well 331 and the emitter electrode 325. The other configurations are the same as those of the RC-IGBT 301 (FIGS. 1 to 3), so that descriptions will be omitted.

\<Effects\>

The semiconductor device (RC-IGBT 301B) in the second modification of the preferred embodiment of the present invention further includes the termination region 306 located on the semiconductor substrate so as to surround the insulated gate bipolar transistor (IGBT 303) and the freewheeling diode (diode 302) in plan view. The first electrode (emitter electrode 325) is also connected to the termination region 306. The resistance element 351 is also located between the termination region 306 and the first electrode.

The second modification increases the area of the p-well to which the resistance element 351 is applied, so that the recovery properties can be more improved.

\<Third Modification of Preferred Embodiment of the Present Invention\>

Figure 6:
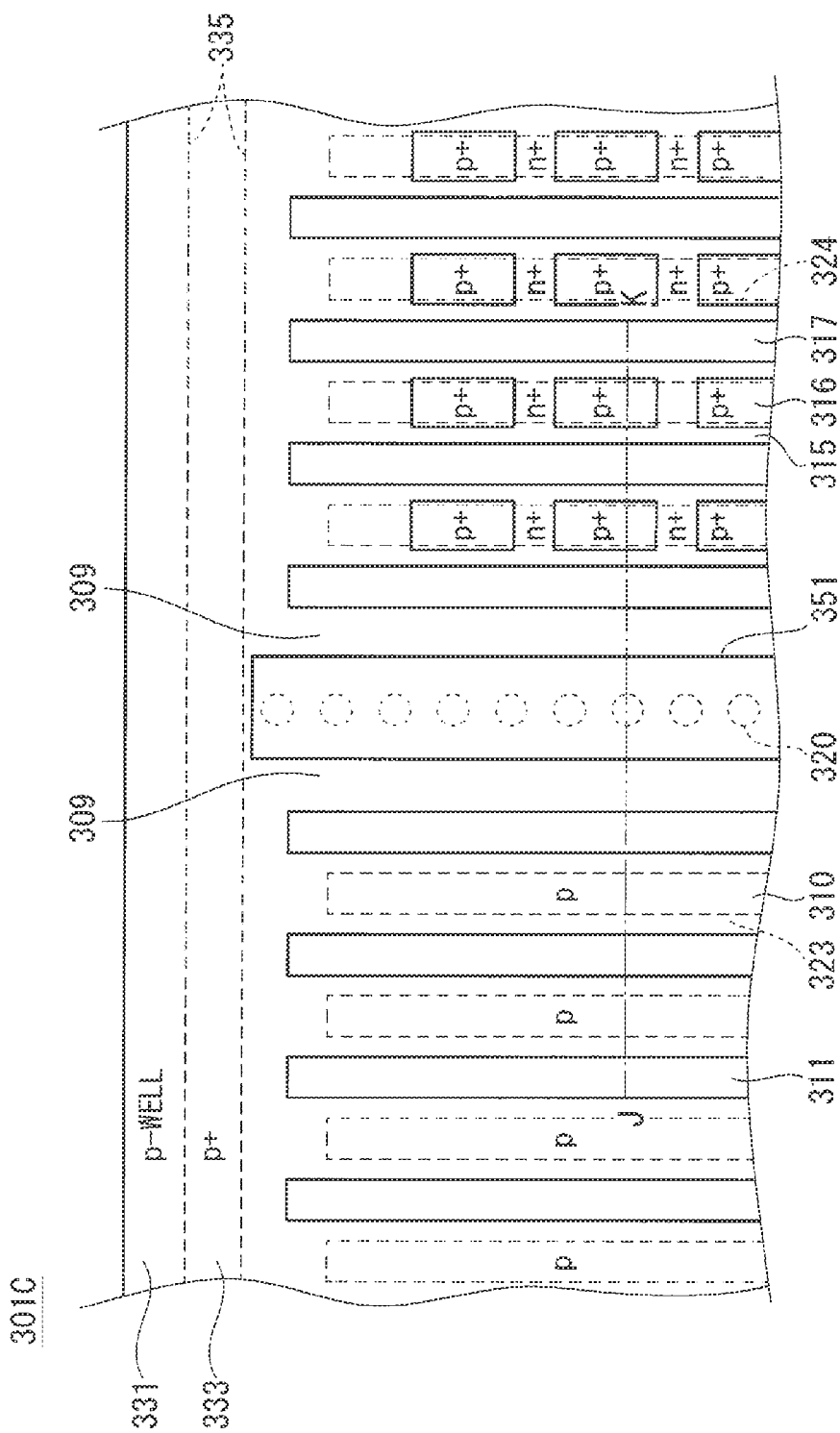
FIG. 6 is a plan view of a semiconductor device in a third modification of the preferred embodiment of the present invention.

The shape of the opening 320 that connects the p-well 309 and the resistance element 351 in the RC-IGBT 301 in the preferred embodiment of the present invention is modified in a RC-IGBT 301C in a third modification. FIG. 6 is a plan view of the semiconductor device (RC-IGBT 301C) in the third modification. As shown in FIG. 6, openings 320 include a plurality of openings separated from each other in the third modification. The other configurations are the same as those of the RC-IGBT 301 (FIGS. 1 to 3), so that descriptions will be omitted.

\<Effects\>

In the semiconductor device (RC-IGBT 301C) in the third modification of the preferred embodiment of the present invention, the well region 304 and the first electrode (emitter electrode 325) are connected to each other through the plurality of openings (openings 320) separated from each other, and the resistance element 351 is located in each of the plurality of openings.

Therefore, the opening 320 in the RC-IGBT 301 (FIG. 3) has the continuous slit shape, but the openings 320 in the third modification include the plurality of openings separated from each other. This configuration increases a contact resistance between the p-well 309 and the emitter electrode 325, so that the recovery properties can be more improved.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   an insulated gate bipolar transistor including an emitter layer on a first main surface side of a semiconductor substrate and a collector layer on a second main surface side of said semiconductor substrate;
   a freewheeling diode including an anode layer on said first main surface side of said semiconductor substrate and a cathode layer on said second main surface side of said semiconductor substrate;
   a well region that is located in a boundary between said insulated gate bipolar transistor and said freewheeling diode and separates said insulated gate bipolar transistor and said freewheeling diode;
   a first electrode located on said first main surface of said semiconductor substrate so as to be connected to said emitter layer, said anode layer, and said well region;
   a resistance element located only between said well region and said first electrode;
   a second electrode located on said second main surface of said semiconductor substrate so as to be connected to said collector layer and said cathode layer; and
   an insulating film located between said first electrode and said well region including at least one opening, wherein said resistance element is located in said opening, and said first electrode and said well region are electrically connected through said resistance element.

2. The semiconductor device according to claim 1, wherein said well region overlaps said collector layer so as to be included in said collector layer in plan view.

3. The semiconductor device according to claim 1, further comprising a termination region located on said semiconductor substrate so as to surround said insulated gate bipolar transistor and said freewheeling diode in plan view, wherein
   said first electrode is also connected to said termination region, and
   said resistance element is also located between said termination region and said first electrode.

4. The semiconductor device according to claim 1, wherein
   said at least one opening includes a plurality of openings,
   said well region and said first electrode are connected to each other through said plurality of openings separated from each other, and
   said resistance element is located in each of said plurality of openings.

5. The semiconductor device according to claim 1, wherein said resistance element comprises polysilicon.

6. The semiconductor device according to claim 1, wherein said resistance element comprises titanium.

7. The semiconductor device according to claim 1, wherein said resistance element comprises cobalt.

8. The semiconductor device according to claim 1, wherein said insulated gate bipolar transistor comprises an injection enhanced type.

9. The semiconductor device according to claim 1, wherein
   the boundary is directly above a junction of the collector layer and the cathode layer.

\* \* \* \* \*